United States Patent
Lee et al.

(10) Patent No.: US 9,699,852 B2
(45) Date of Patent: Jul. 4, 2017

(54) DEVICE AND METHOD FOR CONTROLLING INSULATION SWITCH

(71) Applicant: LG CHEM, LTD., Seoul (KR)

(72) Inventors: Taejoong Lee, Daejeon (KR); Sang Hoon Lee, Daejeon (KR); Younghwan Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 15/305,774

(22) PCT Filed: Oct. 1, 2015

(86) PCT No.: PCT/KR2015/010385
§ 371 (c)(1),
(2) Date: Oct. 21, 2016

(87) PCT Pub. No.: WO2016/056786
PCT Pub. Date: Apr. 14, 2016

(65) Prior Publication Data
US 2017/0048942 A1      Feb. 16, 2017

(30) Foreign Application Priority Data

Oct. 8, 2014  (KR) .................. 10-2014-0136173

(51) Int. Cl.
*H05B 33/08*   (2006.01)
*H03K 17/72*   (2006.01)
*H03K 17/78*   (2006.01)

(52) U.S. Cl.
CPC ......... *H05B 33/0845* (2013.01); *H03K 17/72* (2013.01); *H03K 17/78* (2013.01); *H05B 33/0884* (2013.01)

(58) Field of Classification Search
CPC   H05B 33/08; H05B 33/0845; H05B 33/0884; H03K 17/72; H03K 17/78; H03K 17/35
See application file for complete search history.

(56) References Cited

U.S. PATENT DOCUMENTS 4,767,944 A    8/1988  Takeuchi et al.
8,315,073 B2 * 11/2012  Matsumoto ............. H02M 1/34
                                                 363/21.06

(Continued)

FOREIGN PATENT DOCUMENTS

KR     10-1986-0006818 A     9/1986
KR     10-2005-0120173 A    12/2005

(Continued)

OTHER PUBLICATIONS

International Search Report, issued in PCT/KR2015/010385 (PCT/ISA/210), dated Feb. 29, 2016.

(Continued)

*Primary Examiner* — Thai Pham
(74) *Attorney, Agent, or Firm* — Birch, Stewart, Kolasch & Birch, LLP (57) ABSTRACT

An apparatus and a method for controlling an isolated switch are disclosed. The apparatus and the method for controlling an isolated switch according to the present invention, configure a circuit so as to maintain a light emitting diode (LED) included in an isolated switch in an OFF state at normal times and control the LED in an ON state when an event occurs in an isolated switch such as a photo MOS relay to reduce power consumed for emitting the LED by decreasing a duration for which the LED is maintained in an emission state and improve durability of a system adopting the isolated switch by improving a life-span of the isolated switch.

10 Claims, 4 Drawing Sheets

(56) References Cited

U.S. PATENT DOCUMENTS

2009/0161391 A1* 6/2009 Matsumoto ....... H02M 3/33592
  363/24
2010/0188872 A1 7/2010 Matsumoto et al.

FOREIGN PATENT DOCUMENTS

KR  10-0567245 B1  4/2006
KR  10-2011-0058846 A  6/2011
WO  2010/035082 A2  4/2010

OTHER PUBLICATIONS

Written Opinion of the International Searching Authority, issued in PCT/KR2015/010385 (PCT/ISA/237), dated Feb. 29, 2016.

* cited by examiner

DEVICE AND METHOD FOR CONTROLLING INSULATION SWITCH

TECHNICAL FIELD

This application claims priority to and the benefit of Korean Patent Application No. 10-2014-0136173 filed in the Korean Intellectual Property Office on Oct. 8, 2014, the entire contents of which are incorporated herein by reference.

The present invention relates to an apparatus and a method for controlling an isolated switch, and to an apparatus and a method for controlling an isolated switch, which configure a circuit so as to maintain a light emitting diode (LED) included in an isolated switch in an OFF state at normal times and control the LED in an ON state when an event occurs in an isolated switch such as a photo MOS relay to reduce power consumed for emitting the LED by decreasing a duration for which the LED is maintained in an emission state and improve durability of a system adopting the isolated switch by improving a life-span of the isolated switch.

BACKGROUND ART

In a multi-system including two or more systems, a relay can be used for controlling transmission of data or signals between the systems. In particular, when isolation between the systems is required, an isolated switch such as a photo MOS relay is used.

In the multi-system using the photo MOS relay in the related art, in the case where transmission of data or signals from a primary system to a secondary system is controlled, in general, when an LED of the photo MOS relay is in an ON state, a contact of a load of the secondary system is connected and when an event such as an emergency situation occurs and the contact of the load thus needs to be cut, the LED becomes in an OFF state and the contact of the load is configured to be cut.

As described above, in the system in the related art in which the LED included in the isolated switch is in an emission state at normal times and the LED is turned off when the event occurs, a duration for which the LED is maintained in the emission state is long, and as a result, power consumed for emitting the LED is wasted and a life-span of the isolated switch including the LED is shortened, and as a result, durability of the system adopting the isolated switch deteriorates.

Therefore, in the system in the related art, which includes the isolated switch, it is preferable to decrease the duration for which the LED is maintained in the emission state.

In particular, in an energy storage system using a secondary battery, a system having a stop function in an emergency situation requires designing a structure to maintain the LED of the isolated switch in the off state at normal times and control the LED in the on state in the emergency situation.

DETAILED DESCRIPTION OF THE INVENTION

Technical Problem

An object of the present invention is to provide an apparatus and a method for controlling an isolated switch, which configure a circuit so as to maintain a light emitting diode (LED) included in an isolated switch in an OFF state at normal times and control the LED in an ON state when an event occurs in an isolated switch such as a photo MOS relay to reduce power consumed for emitting the LED by decreasing a duration for which the LED is maintained in an emission state and improve durability of a system adopting the isolated switch by improving a life-span of the isolated switch.

Technical Solution

An apparatus for controlling an isolated switch according to an embodiment of the present invention is configured to include: a first current source; an event signal generating unit generating a high signal at normal times and generating a low signal when an event occurs; a transistor switch connected with the first current source and the event signal generating unit and being in an off state when receiving the high signal from the event signal generating unit and being in an on state when receiving the low signal; an isolated switch having an input terminal connected with the transistor switch and being maintained in the off state when current does not flow on the input terminal and then, being in the on state when current from the first current source flows on the input terminal as the transistor switch becomes in the on state; and a contact control unit connected to an output terminal of the isolated switch, and maintaining a contact of a load in the on state when the isolated switch is in the off state and controlling the contact of the load in the off state as the isolated switch becomes in the on state.

The contact control unit may include a second current source connected to one side of the output terminal; a resistor connected to the other side of the output terminal and to which voltage is not applied as the current does not flow when the isolated switch is in the off state and to which the voltage is applied as current from the second current source flows through the output terminal when the isolated switch becomes in the on state; a not circuit unit connected to the resistor and receiving 0 as an input signal to output 1 when the voltage is not applied to the resistor and receiving 1 as the input signal to output 0 when the voltage is applied to the resistor; and a contact connection unit connected to the not circuit unit and controlling the contact of the load in the on state when receiving 1 output from the not circuit unit as the input signal and controlling the contact of the load in the off state when receiving 0 output from the not circuit unit as the input signal.

The isolated switch may be a photo MOS relay including a light emitting diode (LED) which is emitted by the current that flows on the input terminal as the transistor switch becomes in the on state.

The transistor switch may include a PNP type transistor.

A method for controlling an isolated switch according to an embodiment of the present invention is configured to include: generating, by an event signal generating unit, a high signal; being, by a transistor switch connected with a first current source and the event signal generating unit, in an off state when receiving the high signal from the event signal generating unit; being, by an isolated switch, maintained in the off state as current does not flow on an input terminal of the isolated switch connected with the transistor switch when the transistor switch is maintained in the off state; and; and maintaining, by a contact control unit connected to an output terminal of the isolated switch, a contact of a load in an on state when the isolated switch is in the off state.

The maintaining of the contact of the load in the on state may include maintaining voltage not to be applied to a resistor as the current does not flow on the resistor connected to the output terminal of the isolated switch when the isolated switch is in the off state; receiving, by a not circuit unit connected to the resistor, 0 as an input signal to output 1 when the voltage is not applied to the resistor; and controlling, by a contact connection unit connected to the not circuit unit, the contact of the load in the on state when receiving 1 output from the not circuit unit as the input signal.

The method for controlling an isolated switch is configured to include: generating, by the event signal generating unit, a low signal when an event occurs; being, by the transistor switch, in the on state when receiving the low signal from the event signal generating unit; being, by the isolated switch, in the on state as current from the first current source flows on the input terminal of the isolated switch when the transistor switch is in the on state; and controlling, by the contact control unit, the contact of the load in the off state as the isolated switch becomes in the on state.

The controlling of the contact of the load in the off state may include: applying the voltage to the resistor as current from a second current source connected to one side of the output terminal flows on a resistor connected to the other side of the output terminal through the output terminal when the isolated switch becomes in the on state; receiving, by a not circuit unit connected to the resistor, 1 as an input signal to output 0 when the voltage is applied to the resistor; and controlling, by a contact connection unit connected to the not circuit unit, the contact of the load in the off state when receiving 0 output from the not circuit unit as the input signal.

The isolated switch may be a photo MOS relay including a light emitting diode (LED) which is emitted by the current that flows on the input terminal as the transistor switch becomes in the on state.

The transistor switch may include a PNP type transistor.

Advantageous Effects

According to an aspect of the present invention, it is possible to provide an apparatus and a method for controlling an isolated switch, which configure a circuit so as to maintain a light emitting diode (LED) included in an isolated switch in an OFF state at normal times and control the LED in an ON state when an event occurs in an isolated switch such as a photo MOS relay to reduce power consumed for emitting the LED by decreasing a duration for which the LED is maintained in an emission state and improve durability of a system adopting the isolated switch by improving a life-span of the isolated switch.

BEST MODE

The present invention will be described below in detail with reference to the accompanying drawings. Herein, a repeated description and a detailed description of a known function and a know constitution which may unnecessarily obscure the spirit of the present invention will be omitted. The embodiment are provided to more completely describe the present invention to those skilled in the art. Accordingly, the shape, the size, etc., of elements in the figures may be exaggerated for explicit comprehension.

Throughout the specification, unless explicitly described to the contrary, the word "comprise" and variations such as "comprises" or "comprising", will be understood to imply the inclusion of stated elements but not the exclusion of any other elements.

Further, the term "unit" disclosed in the specification means a unit that processes at least one function or operation and this may be implemented by hardware or software or a combination of hardware and software.

Figure 1:
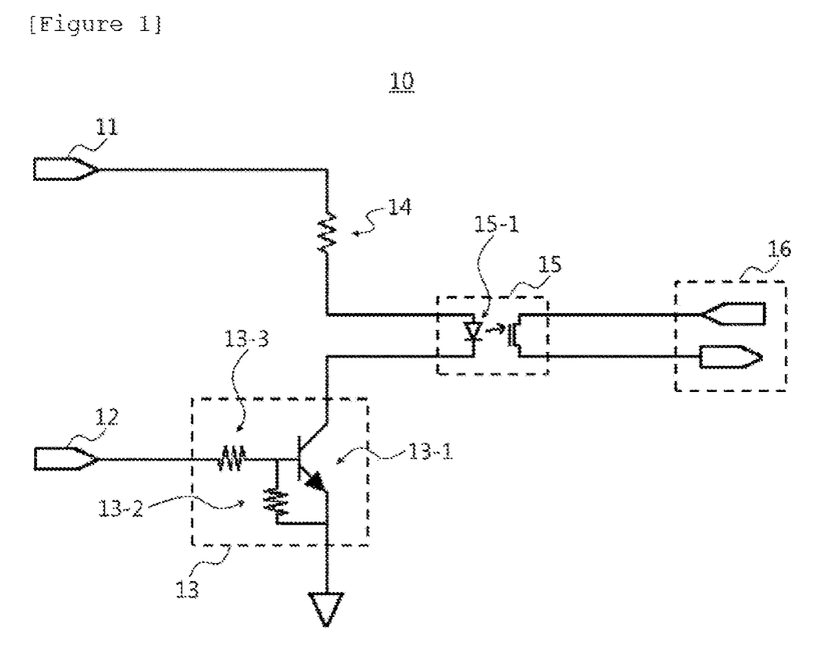
FIG. 1 is a diagram illustrating an apparatus for controlling an isolated switch in the related art.

FIG. 1 is a diagram illustrating an apparatus for controlling an isolated switch in the related art.

Referring to FIG. 1, the apparatus 10 for controlling an isolated switch in the related art is configured to include a first current source 11, an event signal generating unit 12, a transistor switch 13, a resistor 14, an isolated switch 15, and a contact control unit 16.

In the apparatus 10 for controlling an isolated switch in the related art, a first current source 11 applies current and the event signal generating unit 12 generates a high signal at normal times and generates a low signal when an event occurs.

The transistor switch 13 is configured to include an NPN type transistor 13-1 and two resistors 13-2 and 13-3 and operates similarly to a transistor switch including a normal NPN type transistor. Since an operating principle of the transistor switch including the NPN type transistor is known, a detailed description of the operating principle will be omitted.

The transistor switch 13 is connected with the first current source 11 and the event signal generating unit 12. Referring to FIG. 1, a base of the transistor switch 13 is connected with the event signal generating unit 12, a collector of the transistor switch 13 is connected with the first current source 11 through the resistor 14, and an emitter of the transistor switch 13 is connected with a ground. When the transistor switch 13 receives the high signal from the event signal generating unit 12, the transistor switch 13 becomes in an on state and when the transistor switch 13 receives the low signal, the transistor switch 13 becomes in an off state.

An input terminal of the isolated switch 15 is connected with the transistor switch 13. When the current flows on the input terminal of the isolated switch 15, the isolated switch 15 maintains in the on state and as the transistor switch 15 becomes in the off state, when the current from the first current source 11 does not flow on the input terminal, the isolated switch 15 becomes in the off state. The isolated switch 15 may be a photo MOS relay including an LED 15-1.

The contact control unit 16 is connected to an output terminal of the isolated switch 15, and when the isolated switch 15 is in the on state, the contract control unit 16 maintains a contact of a load in the on state and as the isolated switch 15 becomes in the off state, the contact control unit 16 controls the contact of the load in the off state.

When an operation of the apparatus 10 for controlling an isolated switch in the related art is organized, since the event signal generating unit 12 generates the high signal at the ordinary times when the event does not occurs, the transistor switch 13 becomes in the on state, and as a result, the current flows through the resistor 14 and the isolated switch 15 becomes in the on state. In this case, when the isolated switch 15 is the photo MOS relay, the LED 15-1 included in the photo MOS relay is emitted by the current. That is, at the ordinary times, the LED 15-1 included in the photo MOS relay is maintained in an emitted state. In addition, the contact control unit 16 maintains the contact in the on state.

In addition, since the event signal generating unit 12 generates the low signal while the event occurs, the transistor switch 13 becomes in the off state, and as a result, the current does not flow through the resistor 14 and the isolated switch 15 becomes in the off state. In this case, when the isolated switch 15 is the photo MOS relay, the current does not flow on the LED 15-1 included in the photo MOS relay, and as a result, the LED 15-1 is turned off. That is, while the event occurs, the LED 15-1 included in the photo MOS relay is turned off. In addition, the contact control unit 16 controls the contact in the off state.

Therefore, in the apparatus 10 for controlling an isolated switch in the related art, since the LED 15-1 included in the isolated switch 15 is in an emission state at the normal times and the LED 15-1 is turned off when the event occurs, a duration for which the LED 15-1 is maintained in the emission state is long, and as a result, power consumed for emitting the LED 15-1 is wasted and a life-span of the isolated switch 15 including the LED 15-1 is shortened, and as a result, durability of the system adopting the isolated switch deteriorates.

Figure 2:
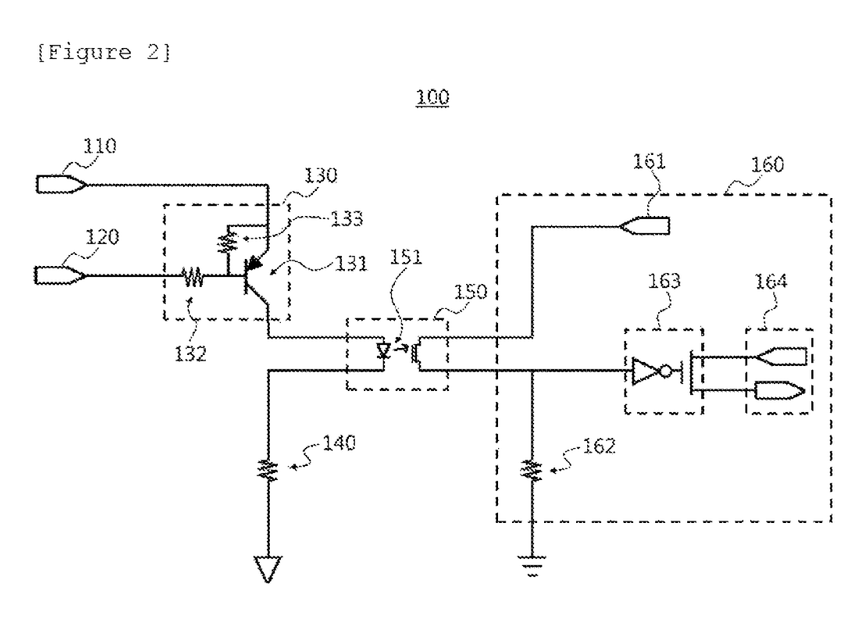
FIG. 2 is a diagram schematically illustrating an apparatus for controlling an isolated switch according to an embodiment of the present invention.

FIG. 2 is a diagram schematically illustrating an apparatus for controlling an isolated switch according to an embodiment of the present invention.

Referring to FIG. 2, the apparatus 100 for controlling an isolated switch according to the embodiment of the present invention may be configured to include a first current source 110, an event signal generating unit 120, a transistor switch 130, a first resistor 140, an isolated switch 150, and a contact control unit 160. The apparatus 100 for controlling an isolated switch, which is illustrated in FIG. 2 is according to the embodiment and components thereof are not limited to the embodiment illustrated in FIG. 2 and some components may be added, changed, or deleted as necessary.

In the apparatus 100 for controlling an isolated switch according to the embodiment of the present invention, a first current source 110 applies current and the event signal generating unit 120 generates a high signal at normal times and generates a low signal when an event occurs.

The transistor switch 130 may be configured to include a PNP type transistor 131 and two resistors 132 and 133 and operates similarly to a transistor switch including a normal PNP type transistor. Since an operating principle of the transistor switch including the PNP type transistor is known, a detailed description of the operating principle will be omitted.

The transistor switch 130 is connected with the first current source 110 and the event signal generating unit 120. Referring to FIG. 2, a base of the transistor switch 130 is connected with the event signal generating unit 120, a collector of the transistor switch 130 is connected with the first current source 110, and an emitter of the transistor switch 130 is connected with the first resistor 140 through an input terminal of the isolated switch 150. When the transistor switch 130 receives the high signal from the event signal generating unit 120, the transistor switch 130 becomes in an off state and when the transistor switch 13 receives the low signal, the transistor switch 130 becomes in an on state.

The input terminal of the isolated switch 150 is connected with the transistor switch 130. When the current does not flow on the input terminal of the isolated switch 150, the isolated switch 150 maintains the off state and as the transistor switch 150 becomes in the on state, when the current from the first current source 110 flows on the input terminal, the transistor switch 150 becomes in the on state. The isolated switch 150 may be a photo MOS relay including an LED 151.

The contact control unit 160 is connected to an output terminal of the isolated switch 150, and when the isolated switch 160 is in the off state, the contract control unit 16 maintains a contact of a load in the on state and as the isolated switch 150 becomes in the on state, the contact control unit 160 controls the contact of the load in the off state.

The contact control unit 160 may be configured to include a second current source 161, a second resistor 162, a not circuit unit 163, and a contact connection unit 164. The contact control unit 160 illustrated in FIG. 2 is according to the embodiment and components thereof are not limited to the embodiment illustrated in FTC. 2 and some components may be added, changed, or deleted as necessary.

The second current source 161 is connected to one side of the output terminal of the isolated switch 150 to apply the current.

The second resistor 162 is connected to the other side of the output terminal of the isolated switch 150 and when the isolated switch 150 is in the off state, the current does not flow and voltage is thus not applied and then, as the isolated switch 150 becomes in the on state, current from the second current source 161 flows through the output terminal, and as a result, the voltage is applied.

The not circuit unit 163 is connected to the second resistor 162 to receive the voltage applied to the second resistor 162 as an input signal. In the embodiment, the not circuit unit 163 receives 0 as the input signal to output 1 when the voltage is not applied to the second resistor 162 and receives 1 as the input signal to output 0 when the voltage is applied to the second resistor 162.

The contact connection unit 164 is connected to the not circuit unit 163 and when the contact connection unit 164 receives 1 output from the not circuit unit 163 as the input signal, the contact connection unit 164 controls the contact of the load in the on state and when the contact connection unit 164 receives 0 output from the not circuit unit 163 as the input signal, the contact connection unit 164 controls the contact of the load in the off state.

Through one example of such a configuration, when the isolated switch 160 is in the off state, the contract control unit 160 maintains the contact of the load in the on state and as the isolated switch 150 becomes in the on state, the contact control unit 160 controls the contact of the load in the off state.

When an operation of the apparatus 100 for controlling an isolated switch according to the embodiment of the present invention is organized, since the event signal generating unit 120 generates the high signal at the ordinary times when the event does not occurs, the transistor switch 130 becomes in the off state, and as a result, the current does not flow through the first resistor 140 and the isolated switch 150 becomes in the off state. In this case, when the isolated switch 150 is the photo MOS relay, the current does not flow on the LED 151 included in the photo MOS relay, and as a result, the LED 151 is not emitted. That is, at the ordinary times, the LED 15-1 included in the photo MOS relay is maintained in the off state. In addition, the contact control unit 160 maintains the contact in the on state.

In addition, since the event signal generating unit 120 generates the low signal while the event is occurs, the transistor switch 130 becomes in the on state, and as a result, the current flows through the first resistor 140 and the isolated switch 150 becomes in the on state. In this case, when the isolated switch 150 is the photo MOS relay, the LED 151 included in the photo MOS relay is emitted by the current. That is, while the event occurs, the LED 151 included in the photo MOS relay is emitted. In addition, the contact control unit 160 controls the contact in the off state.

Accordingly, in the apparatus 100 for controlling an isolated switch according to the embodiment of the present invention, since the LED 151 included in the isolated switch 150 is in the off state at the normal times and when the event occurs, the LED 151 is emitted, a duration for which the LED 151 is maintained in the emission state is long is decreased, and as a result, power consumed for emitting the LED may be reduced and a life-span of the isolated switch 150 including the LED 151 is improved, and as a result, durability of the system adopting the isolated switch may be improved.

Figure 3:
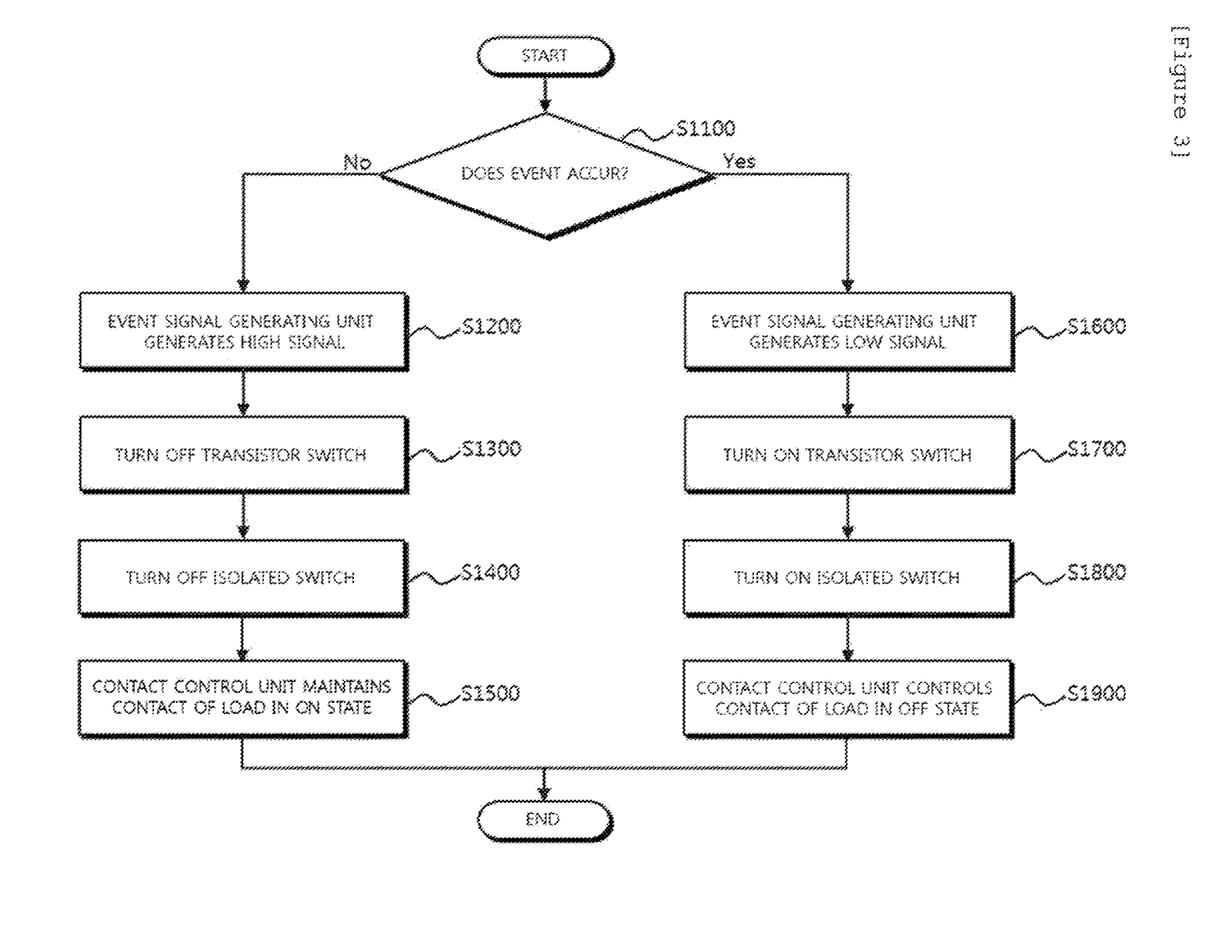
FIG. 3 is a flowchart for describing a method for controlling an isolated switch according to an embodiment of the present invention.

FIG. 3 is a flowchart for describing a method for controlling an isolated switch according to an embodiment of the present invention.

Referring to FIG. 3, when the method for controlling an isolated switch according to the embodiment of the present invention starts, first, an event signal generating unit verifies whether an event occurs (S1100).

When it is verified that the event does not occur in step S1100, that is, at normal times, the event signal generating unit generates a high signal (S1200) and when a transistor switch connected with a first current source and the event signal generating unit receives the high signal from the event signal generating unit, the transistor switch becomes in an off state (S1300).

In addition, as the transistor switch is maintained in the off state, current does not flow on an input terminal of an isolated switch connected with the transistor switch, and as a result, the isolated switch is maintained in the off state (S1400).

Then, a contact control unit connected to an output terminal of the isolated switch maintains a contact of a load in the on state when the isolated switch is in the off state (S1500).

When it is verified that the event occurs in step S1100, the event signal generating unit generates a low signal (S1600) and when the transistor switch receives the low signal from the event signal generating unit, the transistor switch becomes in the on state (S1700).

In addition, as the transistor switch becomes in the on state, current from the first current source flows on the input terminal of the isolated switch, and as a result, the isolated switch becomes in the on state (S1800).

Then, as the isolated switch becomes in the on state, the contact control unit controls the contact of the load in the off state (S1900).

Hereinafter, referring to FIG. 4, a process in which the contact control unit controls the contact of the load in the on state or off state will be described in detail.

Figure 4:
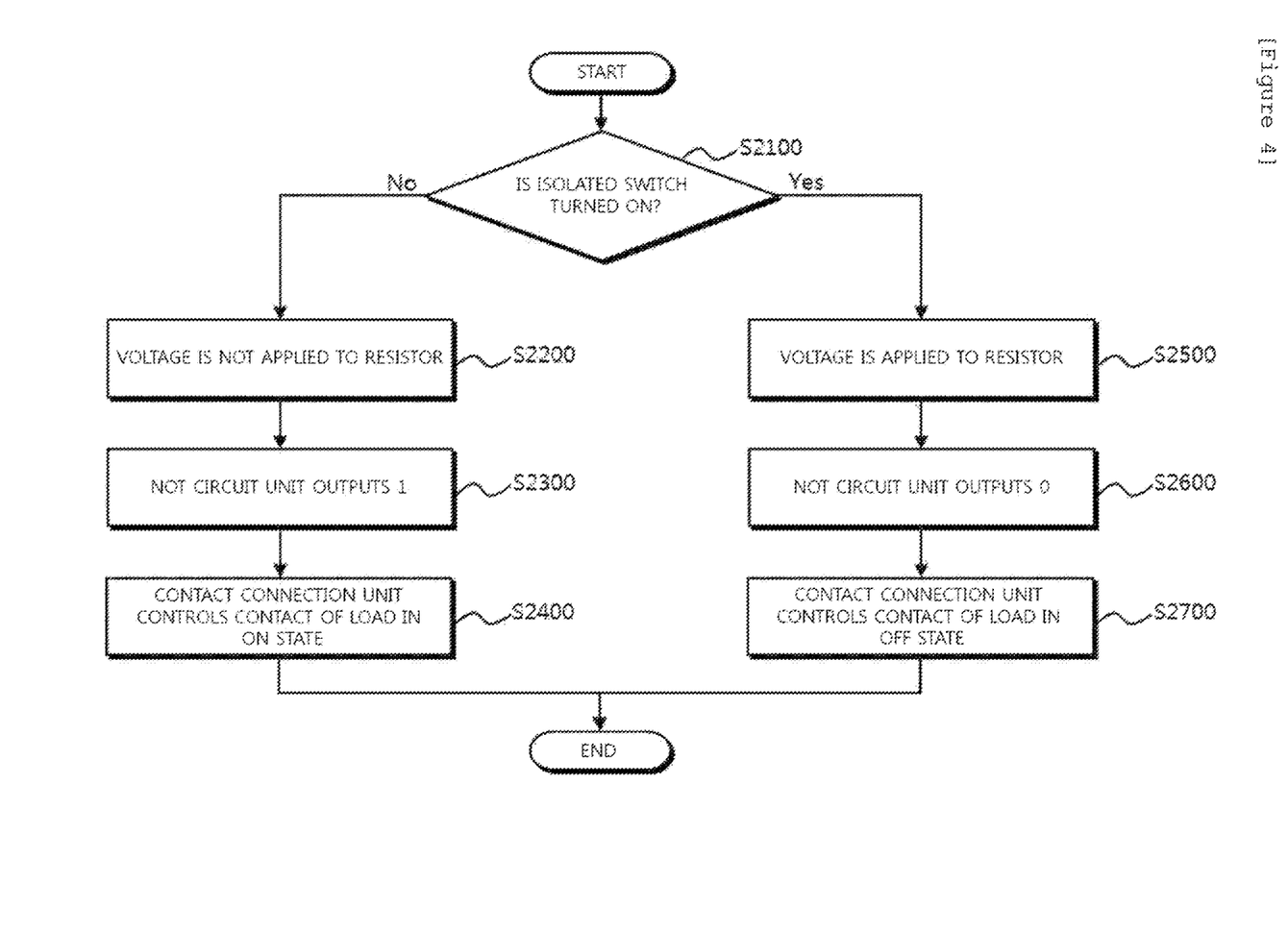
FIG. 4 is a flowchart for describing a process for controlling a contact of a load in a method for controlling an isolated switch according to an embodiment of the present invention.

FIG. 4 is a flowchart for describing a process for controlling a contact of a load in a method for controlling an isolated switch according to an embodiment of the present invention.

When the process for controlling the contact of the load in the method for controlling an isolated switch according to the embodiment of the present invention starts, first, it is verified whether an isolated switch is in an on state (S2100).

When the isolated switch is in an off state in step S2100, current does not flow on a resistor connected to an output terminal of the isolated switch, and as a result, voltage is maintained to be not applied to the resistor (S2200).

In addition, a not circuit unit connected to the resistor receives 0 as an input signal to output 1 when the voltage is not applied to the resistor (S2300).

Then, when a contact connection unit connected to the not circuit unit receives 1 output from the not circuit unit as the input signal, the contact connection unit controls the contact of the load in the on state (S2400).

When the isolated switch is in the on state in step S2100, as the isolated switch becomes in the on state, current from a second current source connected to one side of the output terminal flows on a resistor connected to the other side of the output terminal through the output terminal, and as a result, the voltage is applied to the resistor (S2500).

In addition, the not circuit unit receives 1 as the input signal to output 1 when the voltage is applied to the resistor (S2600).

Then, when the contact connection unit receives 0 output from the not circuit unit as the input signal, the contact connection unit controls the contact of the load in the off state (S2700).

The aforementioned method for controlling an isolated switch has been described with reference to the flowchart presented in the drawings. For easy description, the method has been illustrated and described by a series of blocks, but the present invention is not limited to the order of the blocks and some blocks may occur in the different order from or simultaneously with other blocks illustrated and described in the present specification and various other branches, flow paths, and block orders that achieve the same or similar result may be implemented. Further, all blocks illustrated may not be required for implementing the method described in the present invention specification.

Hereinabove, the specific embodiments of the present invention have been illustrated and described, but the technical spirit of the present invention is not limited to the accompanying drawing and the described contents and it is apparent to those skilled in the art that various modifications can be made without departing from the spirit of the present invention and it will be construed that the modifications are included in the appended claims of the present invention within the scope which does not violate the spirit of the present invention.

The invention claimed is:

1. An apparatus for controlling an isolated switch, the apparatus comprising:
    a first current source;
    an event signal generating unit generating a high signal at normal times and generating a low signal when an event occurs;
    a transistor switch connected with the first current source and the event signal generating unit and being in an off state when receiving the high signal from the event signal generating unit and being in an on state when receiving the low signal;
    an isolated switch having an input terminal connected with the transistor switch and being maintained in the off state when current does not flow on the input terminal and then, being in the on state when current from the first current source flows on the input terminal as the transistor switch becomes in the on state; and
    a contact control unit connected to an output terminal of the isolated switch, and maintaining a contact of a load in the on state when the isolated switch is in the off state and controlling the contact of the load in the off state as the isolated switch becomes in the on state.

2. The apparatus of claim 1, wherein the contact control unit includes:
   a second current source connected to one side of the output terminal;
   a resistor connected to the other side of the output terminal and to which voltage is not applied as the current does not flow when the isolated switch is in the off state and to which the voltage is applied as current from the second current source flows through the output terminal when the isolated switch becomes in the on state;
   a not circuit unit connected to the resistor and receiving 0 as an input signal to output 1 when the voltage is not applied to the resistor and receiving 1 as the input signal to output 0 when the voltage is applied to the resistor; and
   a contact connection unit connected to the not circuit unit and controlling the contact of the load in the on state when receiving 1 output from the not circuit unit as the input signal and controlling the contact of the load in the off state when receiving 0 output from the not circuit unit as the input signal.

3. The apparatus of claim 1, wherein the isolated switch is a photo MOS relay including a light emitting diode (LED) which is emitted by the current that flows on the input terminal as the transistor switch becomes in the on state.

4. The apparatus of claim 1, wherein the transistor switch includes a PNP type transistor.

5. A method for controlling an isolated switch, the method comprising:
   generating, by an event signal generating unit, a high signal;
   being, by a transistor switch connected with a first current source and the event signal generating unit, in an off state when receiving the high signal from the event signal generating unit;
   being, by an isolated switch, maintained in the off state as current does not flow on an input terminal of the isolated switch connected with the transistor switch when the transistor switch is maintained in the off state; and
   maintaining, by a contact control unit connected to an output terminal of the isolated switch, a contact of a load in an on state when the isolated switch is in the off state.

6. The method of claim 5, wherein the maintaining of the contact of the load in the on state includes:
   maintaining voltage not to be applied to a resistor as the current does not flow on the resistor connected to the output terminal of the isolated switch when the isolated switch is in the off state;
   receiving, by a not circuit unit connected to the resistor, 0 as an input signal to output 1 when the voltage is not applied to the resistor; and
   controlling, by a contact control unit connected to the not circuit unit, the contact of the load in the on state when receiving 1 output from the not circuit unit as the input signal.

7. The method of claim 5, comprising:
   generating, by the event signal generating unit, a low signal when an event occurs;
   being, by the transistor switch, in the on state when receiving the low signal from the event signal generating unit;
   being, by the isolated switch, in the on state as current from the first current source flows on the input terminal of the isolated switch when the transistor switch is in the on state; and
   controlling, by the contact control unit, the contact of the load in the off state as the isolated switch becomes in the on state.

8. The method of claim 7, wherein the controlling of the contact of the load in the off state includes:
   applying the voltage to the resistor as current from a second current source connected to one side of the output terminal flows on a resistor connected to the other side of the output terminal through the output terminal when the isolated switch becomes in the on state;
   receiving, by a not circuit unit connected to the resistor, 1 as an input signal to output 0 when the voltage is applied to the resistor; and
   controlling, by a contact connection unit connected to the not circuit unit, the contact of the load in the off state when receiving 0 output from the not circuit unit as the input signal.

9. The method of claim 5, wherein the isolated switch is a photo MOS relay including a light emitting diode (LED) which is emitted by the current that flows on the input terminal as the transistor switch becomes in the on state.

10. The method of claim 5, wherein the transistor switch includes a PNP type transistor.

* * * * *